(12) United States Patent
Tagami (10) Patent No.: US 7,039,149 B2
(45) Date of Patent: May 2, 2006

(54) DATA CLOCK REGENERATING APPARATUS

(75) Inventor: Hitoyuki Tagami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 757 days.

(21) Appl. No.: 10/095,518

(22) Filed: Mar. 13, 2002

(65) Prior Publication Data

US 2003/0091138 A1    May 15, 2003

(30) Foreign Application Priority Data

Nov. 14, 2001    (JP)    ............................. 2001-349319

(51) Int. Cl.
*H03D 3/24* (2006.01)
(52) U.S. Cl. ...................... 375/376; 327/156
(58) Field of Classification Search ................ 375/294, 375/327, 371, 375, 376, 215, 373–374; 327/147, 327/156, 141, 148, 157; 370/516, 503
See application file for complete search history.

(56) References Cited

U.S. PATENT DOCUMENTS

| 4,500,851 A | * | 2/1985 | Sawa et al. ................... 331/2 |
| 5,038,115 A | * | 8/1991 | Myers et al. ................... 331/2 |
| 6,067,335 A | * | 5/2000 | Yamanoi et al. ............ 375/374 |
| 6,275,553 B1 | * | 8/2001 | Esaki ........................ 375/371 |
| 6,433,599 B1 | * | 8/2002 | Friedrich et al. ............ 327/165 |
| 6,611,175 B1 | * | 8/2003 | Heymann ...................... 331/2 |
| 6,636,575 B1 | * | 10/2003 | Ott ............................. 375/376 |
| 6,876,651 B1 | * | 4/2005 | Grohn ........................ 370/375 |

FOREIGN PATENT DOCUMENTS

| JP | SHO 63-136718 | 6/1988 |
| JP | HEI 3-258022 | 11/1991 |
| JP | 2000-3563 | 1/2000 |

OTHER PUBLICATIONS

T.H. Lee, et al., A 155-MHz Clock Recovery Delay-and Phase-Locked Loop, IEEE Journal of Solid-state circuits, vol. 27, No. 12, Dec. 1992, pp. 1736-1747.

* cited by examiner

*Primary Examiner*—Khanh Tran
(74) *Attorney, Agent, or Firm*—Buchanan Ingersoll PC (57) ABSTRACT

The present invention comprises a phase-locked loop which generates a first clock signal, and a phase-locked loop which generates a second clock signal. An upper limit value of a jitter transmission frequency in the phase-locked loop in which a jitter signal is transmitted to the first clock signal without being suppressed, is not less than an upper limit value of a jitter transmission frequency. An upper limit value of a jitter transmission frequency from the phase-locked loop to the phase-locked loop in which a jitter signal is transmitted to the second clock signal without being suppressed, is not more than an upper limit value of a jitter transmission frequency.

6 Claims, 8 Drawing Sheets

PRIOR ART

PRIOR ART

PRIOR ART

FIG.8A

PRIOR ART

FIG.8B

DATA CLOCK REGENERATING APPARATUS

FIELD OF THE INVENTION

This invention relates to a data clock regenerating apparatus which regenerates a clock signal from an input data signal, and regenerates the input data signal by discriminating this data signal according to the regenerated clock signal.

BACKGROUND OF THE INVENTION

Figure 6:
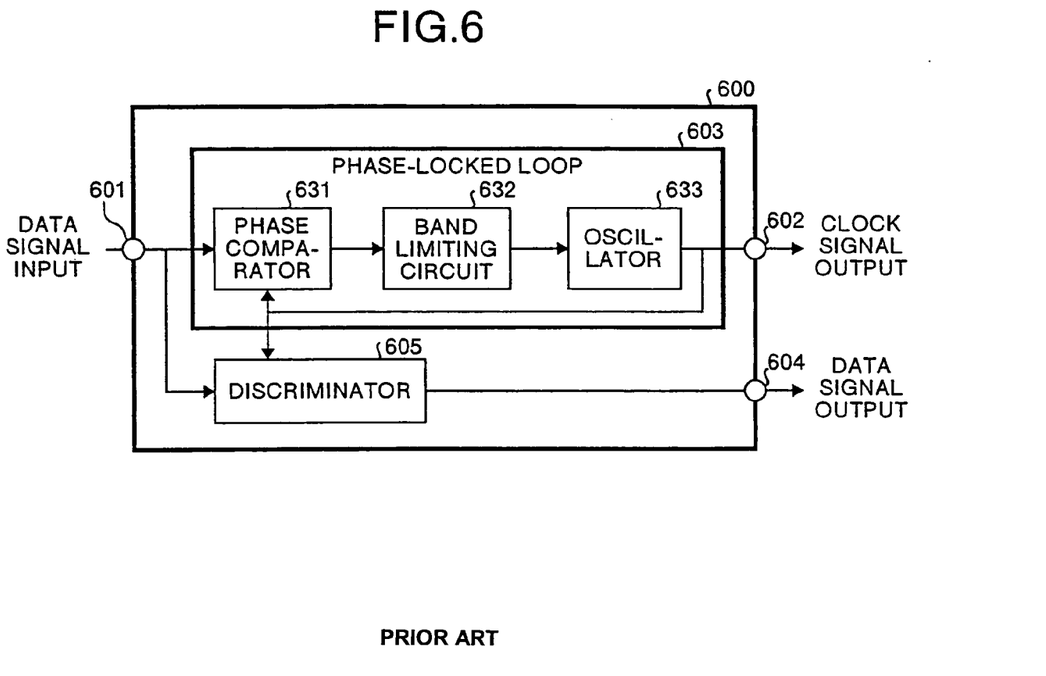
FIG. 6 is a block diagram showing a structure of the conventional data clock regenerating apparatus.

As a conventional data clock regenerating apparatus which regenerates a clock signal from an input data signal, and regenerates the input data signal by discriminating this input data signal according to the regenerated clock signal, there is, for example, an apparatus that is disclosed in the literature "A 155-MHz Clock Recovery Delay-and Phase-Locked Loop" (IEEE JOURNAL Solid-state Circuits, vol. 27, No. 12, pp. 1736–1746, DECEMBER 1992, by Thomas H. Lee, John F. Bulzacchelli). FIG. 6 shows an example of a structure of the conventional data clock regenerating apparatus indicated in the literature.

In FIG. 6, a data clock regenerating apparatus 600 has a phase-locked loop 603 provided between a data signal input terminal 601 and a clock signal output terminal 602, and has a discriminator 605 provided between the data signal input terminal 601 and a data signal output terminal 604. The phase-locked loop 603 includes a phase comparator 631, a band limiting circuit 632, and an oscillator 633, as a basic structure.

The phase comparator 631 compares a phase of a data signal that is input from the data signal input terminal 601 with a phase of a clock signal that is output from the oscillator 633, and outputs a result of the phase comparison to the band limiting circuit 632. The band limiting circuit 632 extracts a low-frequency component from the input result of the phase comparison, and outputs this low-frequency component to the oscillator 633 as a control signal. The oscillator 633 generates a clock signal of a frequency corresponding to a level of the input control signal, and outputs this clock signal to the clock signal output terminal 602, the phase comparator 631, and the discriminator 605. The discriminator 605 discriminates the data signal that is input from the data signal input terminal 601, based on the clock signal that is input from the oscillator 633, and outputs the regenerated data signal to the data signal output terminal 604.

The operation of the conventional data clock regenerating apparatus 600 will be explained below. In the data clock regenerating apparatus 600, the phase-locked loop 603 extracts a clock signal from an input data signal (frequency synchronization), and carries out a phase control (phase synchronization) at the same time. In parallel, the discriminator 605 discriminates the input data signal in an optimum clock phase of the clock signal that has been regenerated in the phase-locked loop 603. There are various structures for each element that constitutes the phase-locked loop 603. As the operation which realizes the frequency synchronization and the phase synchronization has been known well, a concept of one example of a synchronous operation in the phase-locked loop 603 will be explained with reference to FIG. 7A, FIG. 7B, and FIG. 7C.

Figure 7A:
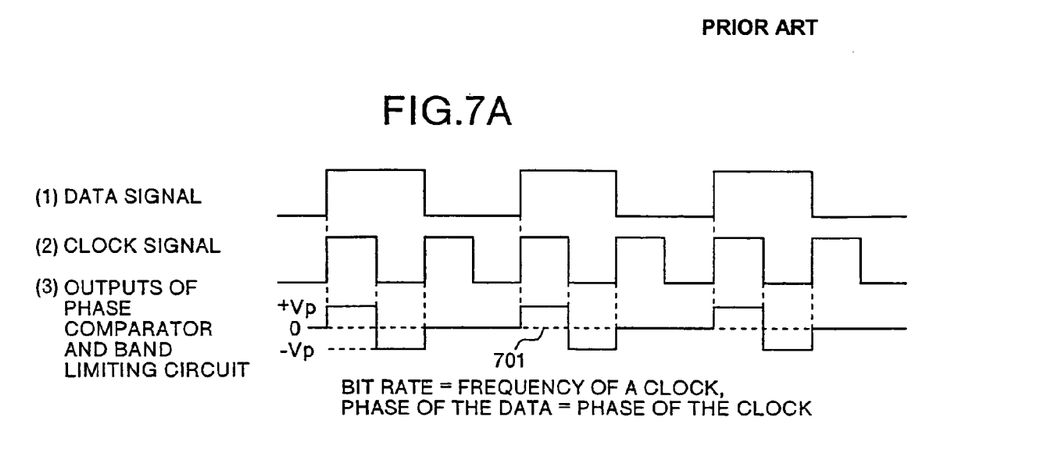
Figure 7B:
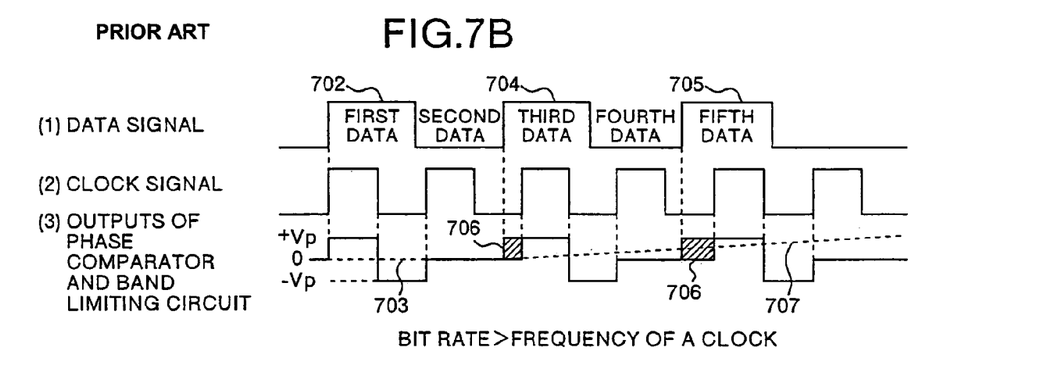
Figure 7C:
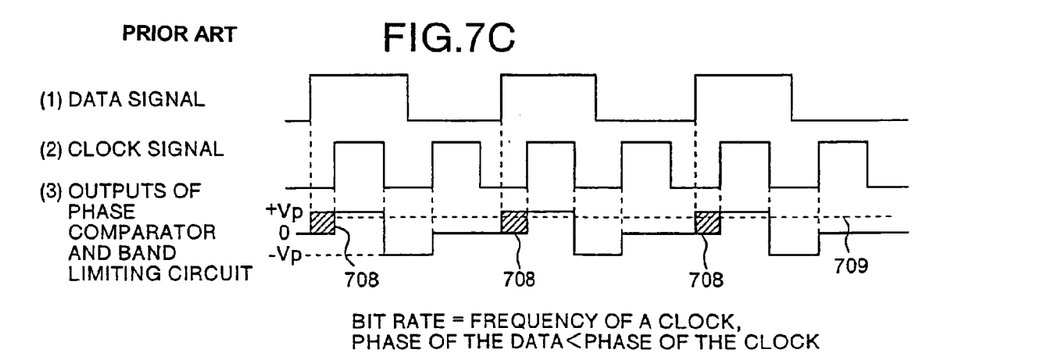

FIG. 7A, FIG. 7B, and FIG. 7C are timing charts that explain the operation of the phase-locked loop 603. FIG. 7A shows a status that a bit rate of a data signal (1) is equal to a frequency of a clock signal (2), and also a phase of a change point of the data signal (1) coincides with a phase of a change point of the clock signal (2). In other words, this shows a stable status that the frequency synchronization and the phase synchronization have been established.

In this status, as shown in FIG. 7A (3), the phase comparator 631 outputs a three-value signal that rises to become +Vp at a rise change-point timing of the data signal (1), falls to become −Vp at a fall change-point timing of the clock signal (2), and rises to become a 0 level at a rise change-point timing of the clock signal (2).

The band limiting circuit 632 has a sufficiently narrow low-frequency transmission band relative to a frequency of the clock signal (2), and outputs an output signal of the phase comparator 631 by band-limiting a high-frequency component of this output signal. In other words, the band limiting circuit 632 outputs an average value of the output signal of the phase comparator 631 to the oscillator 633 as a control signal. FIG. 7A shows a status after both the frequency synchronization and the phase synchronization have been established. Further, the rise change-point timing of the data signal (1) and the rise change-point timing of the clock signal (2) coincide with each other. Therefore, the average value of the output signal of the phase comparator 631 becomes at the 0 level. Consequently, the band limiting circuit 632 outputs a control signal of the 0 level to the oscillator 633 as shown by a thick dotted line 701 in FIG. 7A (3).

The oscillator 633 changes the oscillation frequency according to the output level of the band limiting circuit 632. For example, when the output of the band limiting circuit 632 is at the 0 level, the oscillator 633 maintains the current oscillation frequency. When the output of the band limiting circuit 632 is at a plus (+) potential, the oscillator 633 increases the oscillation frequency according to a difference of potential from the 0 level. When the output of the band limiting circuit 632 is at a minus (−) potential, the oscillator 633 decreases the oscillation frequency according to a difference of potential from the 0 level. In FIG. 7A, as the output of the band limiting circuit 632 is at the 0 level, the oscillator 633 maintains the current oscillation frequency, and thus maintains both the frequency synchronization and the phase synchronization.

FIG. 7B shows a status that a bit rate of the data signal (1) is higher than a frequency of the clock signal (2), and the frequencies are asynchronous. When a rise change-point of a first data 702 coincides with a rise change-point timing of the clock signal (2), an output signal 703 of the band limiting circuit 632 is at the 0 level. Therefore, the oscillator 633 maintains the current oscillation frequency. However, as the bit rate of the data signal (1) is higher than the frequency of the clock signal (2), the rise change-point of a third data 704 or a fifth data 705 becomes earlier than the rise change-point timing of the clock signal (2).

Thus, a pulse width at the plus (+) potential side of the output signal of the phase comparator 631 becomes larger, as shown by a shaded portion 706 in FIG. 7B (3). Therefore, an output signal 707 of the band limiting circuit 632 gradually shifts from the 0 level to the plus (+) potential side. Accordingly, the oscillator 633 increases the oscillation frequency, and operates in a direction to make the rise change-point timing of the data signal (1) coincide with the change-point timing of the clock signal (2). Finally, the operation shown in FIG. 7B is repeated until when the frequency synchronization and the phase synchronization shown in FIG. 7A are established.

FIG. 7C shows a status that the bit rate of the data signal (1) and the frequency of the clock signal (2) are equal and the frequency synchronization has been established, but the rise change-point timing of the data signal (1) is earlier than the rise change-point timing of the clock signal (2). In other words, this shows a status that the phase synchronization of the data phase<the clock phase has not been taken. As the rise change-point timing of the data signal (1) is earlier than the rise change-point timing of the clock signal (2), a pulse width at the plus (+) potential side of the output signal of the phase comparator 631 becomes larger, as shown by a shaded portion 708 in FIG. 7C (3). As a result, an output signal 709 of the band limiting circuit 632 gradually shifts from the 0 level to the plus (+) potential side. Accordingly, the oscillator 633 increases the oscillation frequency, and operates in a direction to make the rise change-point timing of the data signal (1) coincide with the rise change-point timing of the clock signal (2) Finally, the operation shown in FIG. 7C is repeated until when the frequency synchronization and the phase synchronization shown in FIG. 7A are established.

As explained above, the phase-locked loop 603 changes the clock signal frequency based on a result of the comparison between the phase of the data signal change point and the phase of the clock signal change point, thereby to set the signals to a converged status that the frequency synchronization and the phase synchronization shown in FIG. 7A are established. In this converged status, the falling timing of the clock signal (2) is at the center between the change points of the data signal (1), as shown in FIG. 7A. Therefore, the discriminator 605 can discriminate the data signal in an optimum discrimination phase.

Figure 8A:
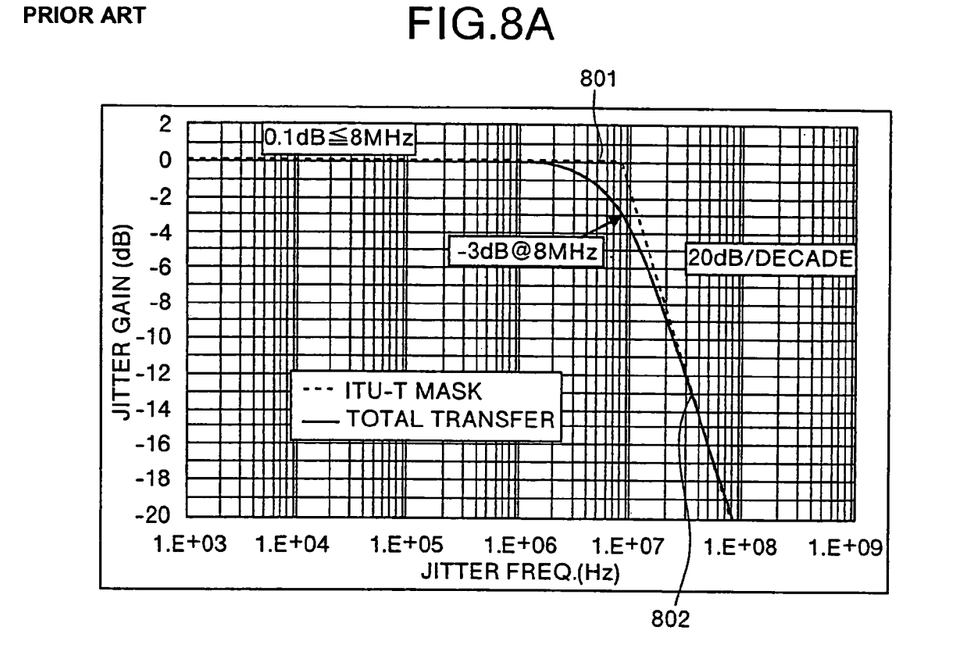
FIG. 8A shows a jitter transfer characteristic and FIG. 8B shows a jitter tolerance characteristic.
Figure 8B:
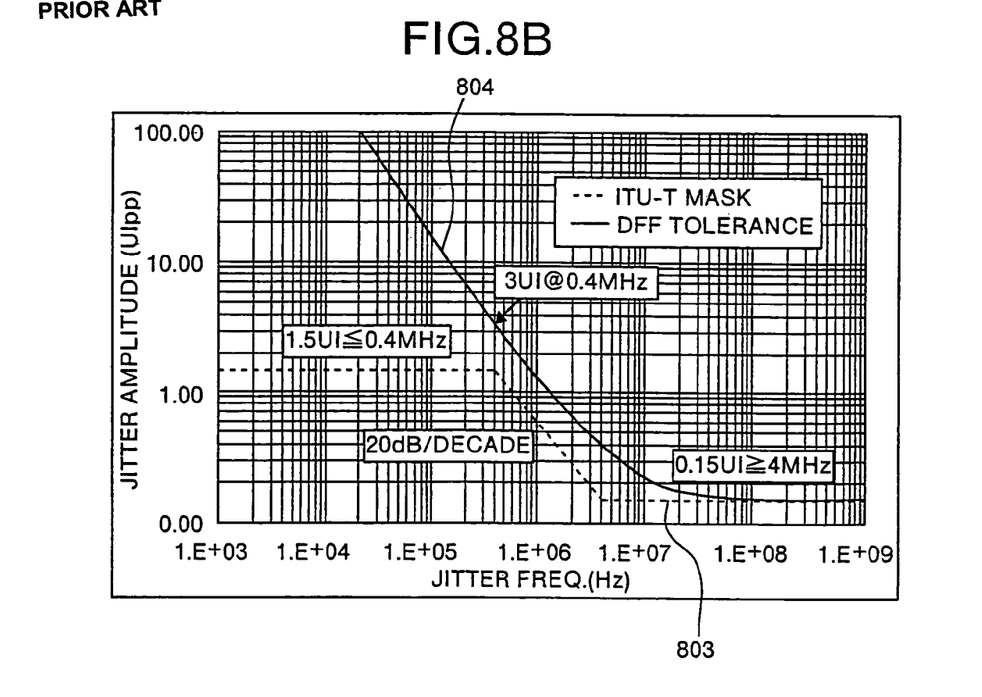

The ITU-T (International Telecommunication Union-Telecommunication Standardization Sector) prescribes a jitter transfer characteristic, a jitter tolerance characteristic, and a jitter generation characteristic, as jitter characteristics that an optical transmission apparatus should satisfy. The jitter characteristics that the data clock regenerating apparatus 600 should satisfy will be explained with reference to FIG. 8A and FIG. 8B. FIG. 8A and FIG. 8B are diagrams that compare the characteristics shown in the ITU-T standard with the characteristics of the data clock regenerating apparatus 600 that have been obtained by setting parameters to satisfy these characteristics. FIG. 8A shows the jitter transfer characteristic, with the jitter frequency (unit Hz) shown in the horizontal axis, and the jitter gain (unit dB) shown in the vertical axis. FIG. 8B shows the jitter tolerance characteristic, with the jitter frequency (unit Hz) shown in the horizontal axis, and the jitter amplitude (unit UIpp) that shows jitter tolerance shown in the vertical axis.

In the data clock regenerating apparatus 600, the jitter transfer characteristic is a jitter-suppress characteristic superimposed on the input data signal in the phase-locked loop 603. In FIG. 8A, an ITU-T Mask (an ITU-T jitter transfer standard mask) 801 indicated by a broken line shows one example of the jitter transfer standard at a transmission speed STM-64 (9.95328 Gbit/s) prescribed by the ITU-T. As shown in the ITU-T Mask 801, it has been prescribed by the ITU-T that an upper limit of a jitter transfer cutoff frequency is 8 MHz, that a jitter having a frequency not higher than 8 MHz is transmitted in a relative gain not higher than 0.1 dB (0.1 dB≦8 MHz), and that a jitter having a frequency not less than 8 MHz is suppressed to a relative gain prescribed by 20 dB/decade or less.

The jitter transfer characteristic in the data clock regenerating apparatus 600 is obtained as follows. The jitter transfer characteristic Jtra(s) and a cutoff angular frequency ωc of the phase-locked loop 603 are obtained from the following equations (1) and (2), where M(s) represents a closed loop transmission function, ζ represents a damping factor, and ωn represents a natural angular frequency of the phase-locked loop 603, respectively.

$$Jtra(s)=Jtra(j\omega)=|M(s)|/|M(0)| \quad (1)$$

$$\omega_c=2\pi f_c=2\zeta\omega_n \quad (2)$$

However, the damping factor ζ and the natural angular frequency ωn are obtained from the following equations (3) and (4), based on an open loop gain of the phase-locked loop 603 and time constants τ1 and τ2 when the band limiting circuit 632 is a lag lead type filter circuit.

$$\zeta=\tau_2\omega_n/2 \quad (3)$$

$$\omega_n=\sqrt{K/(\tau_1+\tau_2)} \quad (4)$$

From the equations (2) to (4), a condition for the cutoff angular frequency to satisfy the jitter transfer standard of the ITU-T is given from the following equation (5).

$$\omega_c=2\pi f_c=K\tau_2/(\tau_1+\tau_2)\leq 2\pi\cdot 8 \text{ MHz} \quad (5)$$

In FIG. 8A, Transfer (jitter transfer characteristics) 802 indicated by a solid line shows one example of the jitter transfer characteristic of the phase-locked loop 603 that has a cutoff frequency fc=8 MHz which satisfies the ITU-T standard obtained from the equation (1). As shown by the Transfer 802, the jitter transfer characteristic obtained from the equation (1) becomes a characteristic that approximately a jitter having a frequency not more than the cutoff frequency fc=8 MHz is transmitted as it is, and a jitter having a frequency not less than the cutoff frequency fc=8 MHz is suppressed with an inclination of 20 dB/decade. To simplify the explanation, in the calculation of the Transfer 802, parameters have been set to make the cutoff frequency coincide with the ITU-T standard value. As the discriminator 605 discriminates the data signal at the output clock timing of the phase-locked loop 603, the jitter transfer characteristic of the output signal of the discriminator 605 becomes the same as the jitter transfer characteristic of the phase-locked loop 603.

The jitter tolerance characteristic is a characteristic that prescribes a maximum jitter amplitude in which the phase-locked loop 603 can generate a jitter-suppressed clock signal to a jitter-superimposed data signal input and the discriminator 605 can discriminate the jitter-superimposed data signal with the jitter-suppressed clock signal, in the data clock regenerating apparatus 600. In FIG. 8B, an ITU-T Mask (an ITU-T jitter transfer prescription mask) 803 indicated by a broken line shows a jitter tolerance standard at a transmission speed STM-128 (9.95328 Gbit/s) prescribed by the ITU-T. As shown in the ITU-T Mask 803, the ITU-T sets an upper limit of a low-level corner frequency of the jitter tolerance to 400 KHz, and sets a lower limit of a high-level corner frequency to 4 MHz. It has been prescribed, that for a jitter having a frequency of not higher than 400 KHz, a signal has discrimination tolerance (1.5 UI≦0.4 MHz) that is not less than the jitter amplitude of 1.5 UI (1 UI=1/9.95328 GHz), that for a jitter having a frequency of 400 KHz to 4 MHz, a signal has discrimination tolerance not less than the jitter amplitude prescribed by 20 dB/decade, and that for a jitter having a frequency of not less than 4 MHz, a signal has discrimination tolerance (0.15 UI≦4 MHz) that is not less than the jitter amplitude of 0.15 UI.

The jitter tolerance characteristic in the data clock regenerating apparatus 600 is obtained as follows. Jitter tolerance characteristic Jtol(s) and a corner angular frequency ωc of the data clock regenerating apparatus 600 are obtained from the following equations (6) and (7), where M(s) represents a closed loop transmission function, ζ represents a damping factor, $\omega_n$ represents a natural angular frequency of the phase-locked loop 603, and $\Phi$ represents a discrimination phase margin of the discriminator 605, respectively.

$$Jtol(s)=Jtol(j\omega)=\Phi/|1-M(s)| \quad (6)$$

$$\omega_c=2\pi f_c=2\zeta\omega_n \quad (7)$$

As a result, it can be known from the equations (2) and (7) that the cutoff frequency of the jitter transfer characteristic and the corner frequency of the jitter tolerance characteristic are equal. In FIG. 8B, DFF Tolerance (jitter transfer characteristic) 804 indicated by a solid line shows one example of the jitter tolerance characteristic of the data clock regenerating apparatus 600 that includes the phase-locked loop 603 having a corner frequency which satisfies the ITU-T standard obtained from the equation (6). To clarify the point at issue, a discrimination phase margin of the discriminator 605 is a worst condition $\Phi$=0.15 UI (1 UI=1/9.95328 GHz) which satisfies the ITU-T standard.

As shown in the DFF Tolerance 804, the jitter tolerance characteristic obtained from the equation (6) is such that approximately the jitter tolerance in the low-level corner frequency 400 KHz is 3.0 UI (3 UI@0.4 MHz). For a jitter having a frequency from the low-level corner frequency of 400 KHz to a frequency of the corner frequency fc=4 MHz, jitter tolerance increases with an inclination of 20 dB/decade toward the low-level corner frequency 400 KHz. For a jitter having a frequency not less than the corner frequency fc=4 MHz, jitter tolerance equal to the discrimination phase margin (0.15 UI) of the discriminator 605 is held (0.15 UI$\geq$4 MHz). Further, from the equation (2) to the equation (4), when the discrimination phase margin of the discriminator 605 is 0.15 UI which is worst, a condition for the corner frequency fc to satisfy the jitter tolerance standard of the ITU-T is given by the following equation (8).

$$\omega_c=2\pi f_c=K\tau_2/(\tau_1+\tau_2)\geq 2\pi \cdot 4 \text{ MHz} \quad (8)$$

Further, the ITU-T prescribes a jitter generation. The jitter generation prescribes a generation of an internal jitter that the phase-locked loop 603 generates to an input data signal not superimposed with a jitter. As this is not directly related to the present invention, this explanation will be omitted.

As explained above, in order to obtain the data clock regenerating apparatus 600 that satisfies both the jitter transfer standard and the jitter tolerance standard prescribed by the ITU-T, it is necessary to satisfy both the equation (5) and the equation (8). In other words, when the discrimination phase margin of the discriminator 605 is the worst 0.15 UI, the cutoff frequency of the jitter transfer characteristic (=the corner frequency of the jitter tolerance characteristic) must be within a narrow frequency range of 4 MHz to 8 MHz.

As given from the equation (2) to the equation (4), the cutoff frequency of the jitter transfer characteristic is determined based on the open loop gain of the phase-locked loop 603 and the time constants $\tau_1$ and $\tau_2$ of the lag lead type filter circuit as the band limiting circuit 632. However, particularly in order to realize the data clock regenerating apparatus 600 on the integrated circuit, there is little design margin which accommodates the cutoff frequency of the jitter transfer characteristic within the above frequency range, including a temperature of an open loop gain K, a power source voltage variation, and a variation in the characteristics of a manufacturing process. Therefore, it is difficult to design with margin.

SUMMARY OF THE INVENTION

It is an object of this invention to provide a data clock regenerating apparatus capable of enlarging the level of design freedom which satisfies both the jitter transfer standard and the jitter tolerance standard prescribed by the ITU-T.

The data clock regenerating apparatus according to this invention comprises a first phase-locked loop which generates a first clock signal that is synchronous with a frequency of an input data signal and that is also in phase synchronism with a change point of the data signal, a first discriminating unit which regenerates the input data signal by discriminating this input data signal with the first clock signal, a second phase-locked loop which generates a second clock signal of which frequency and phase are synchronous with the first clock signal, and a second discriminating unit that regenerates an output data signal of the first discriminating unit by discriminating the output data with the second clock signal, in which the first phase-locked loop and the second phase-locked loop are connected in a file. Accordingly, an upper limit value of a jitter transmission frequency in the first phase-locked loop in which a jitter signal superimposed on the input data signal is transmitted to the first clock signal without being suppressed, is set to a value not less than an upper limit value of a jitter transmission frequency that is required in the apparatus, and an upper limit value of a jitter transmission frequency from the first phase-locked loop to the second phase-locked loop in which a jitter signal superimposed on the input data signal is transmitted to the second clock signal without being suppressed, is set to a value not more than an upper limit value of a jitter transmission frequency that is required in the apparatus.

Other objects and features of this invention will become apparent from the following description with reference to the accompanying drawings.

BRIEF DESCRIPTION OF THE DRAWINGS

FIG. 2A and FIG. 2B are diagrams that compare the characteristics shown in the ITU-T standard with the characteristics of the data clock regenerating apparatus shown in FIG. 1 that have been obtained by setting parameters to satisfy these characteristics in which FIG. 7A, FIG. 7B, and FIG. 7C are timing charts that explain the operation of the phase-locked loop shown in FIG. 6, and FIG. 8A and FIG. 8B are diagrams that compare the characteristics shown in the ITU-T standard with the characteristics of the data clock regenerating apparatus shown in FIG. 6 that have been obtained by setting parameters to satisfy these characteristics in which

DETAILED DESCRIPTION

Embodiments of the data clock regenerating apparatus according to this invention will be explained in detail below with reference to the accompanying drawings.

Figure 1:
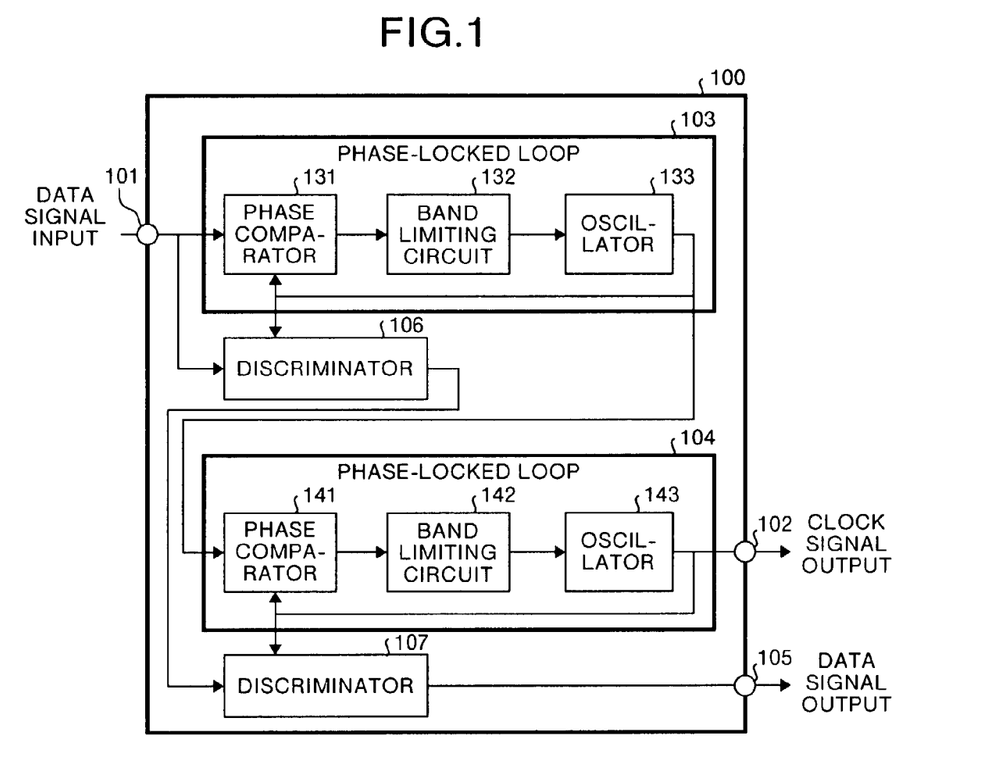
FIG. 1 is a block diagram showing a structure of a data clock regenerating apparatus according to a first embodiment of this invention.

A first embodiment of this invention will be explained below. FIG. 1 is a block diagram showing a structure of a data clock regenerating apparatus according to the first embodiment of this invention. In FIG. 1, a data clock regenerating apparatus 100 has phase-locked loops 103 and 104 connected in a file between a data signal input terminal 101 and a clock signal output terminal 102. Further, discriminators 106 and 107 are connected in series between the data signal input terminal 101 and a data signal output terminal 105.

The phase-locked loop 103 includes a phase comparator 131, a band limiting circuit 132, and an oscillator 133, as a basic structure. The phase comparator 131 compares a phase of a data signal that is input from the data signal input terminal 101 with a phase of a clock signal that is output from the oscillator 133, and outputs a result of the phase comparison to the band limiting circuit 132. The band limiting circuit 132 extracts a low-frequency component from the input result of the phase comparison, and outputs a control signal to the oscillator 133. The oscillator 133 generates a clock signal of a frequency corresponding to a level of the input control signal, and outputs this clock signal to the phase comparator 131 and the discriminator 106 and to the post-stage phase-locked loop 104 as a reference clock. The discriminator 106 discriminates the data signal that is input from the data signal input terminal 101, based on the clock signal that is input from the oscillator 133, and outputs the regenerated data signal to the post-stage data signal output terminal 107.

The phase-locked loop 104 similarly includes a phase comparator 141, a band limiting circuit 142, and an oscillator 143, as a basic structure. The phase comparator 141 compares a phase of a reference clock that is input from the pre-stage phase-locked loop 103 with a phase of a clock signal that is output from the oscillator 143, and outputs a result of the phase comparison to the band limiting circuit 142. The band limiting circuit 142 extracts a low-frequency component from the input result of the phase comparison, and outputs a control signal to the oscillator 143. The oscillator 143 generates a clock signal of a frequency corresponding to a level of the input control signal, and outputs this clock signal to the phase comparator 141 and the discriminator 107 and to the clock signal output terminal 102. The discriminator 107 discriminates the data signal that is input from the pre-stage discriminator 106, based on the clock signal that is input from the oscillator 143, and outputs the regenerated data signal to the data signal output terminal 105.

The operation of the data clock regenerating apparatus 100 having the above structure will be explained below. Referring to FIG. 1, in the data clock regenerating apparatus 100, the pre-stage phase-locked loop 103 extracts a clock signal from an input data signal (frequency synchronization), and carries out a phase control (phase synchronization) at the same time. In parallel, the pre-stage discriminator 106 discriminates the input data signal in an optimum clock phase of the clock signal that has been regenerated in the phase-locked loop 103.

Further, the post-stage phase-locked loop 104 controls a frequency synchronization and a phase synchronization of the reference clock supplied from the pre-stage phase-locked loop 103, based on a similar operation. In parallel, the discriminator 107 discriminates the data signal supplied from the pre-stage discriminator 106 in an optimum clock phase of the clock signal that has been regenerated in the phase-locked loop 104.

The jitter transfer characteristic of the output from the pre-stage phase-locked loop 103 is expressed by the equation (1), and the jitter tolerance characteristic of the output from the discriminator 106 is expressed by the equation (6). Further, the jitter transfer characteristic of the output from the post-stage phase-locked loop 104 is similarly expressed by the equation (1), and the jitter tolerance characteristic of the output from the discriminator 107 is similarly expressed by the equation (6).

The jitter transfer characteristic of the data clock regenerating apparatus 100 is a suppress characteristic of the jitter that is superimposed on the data signal input from the data signal input terminal 101 and that appears in the clock signal output to the clock signal output terminal 102, or that appears in the data signal output from the data signal output terminal 105. Namely, the jitter transfer characteristic of the data clock regenerating apparatus 100 is a suppress characteristic of the clock signal output or the data signal output. The jitter tolerance characteristic of the data clock regenerating apparatus 100 is a maximum jitter amplitude of the jitter superimposed in the data signal that the discriminators 106 and 107 can discriminate with the jitter-suppressed clock signal.

A total jitter transfer characteristic $Jtra_t(s)$ and a total cutoff angular frequency $\omega ct$ of the data clock regenerating apparatus 100 shown in FIG. 1 are obtained from the following equations (9) and (10), where $Ma(s)$ represents a closed loop transmission function of the pre-stage phase-locked loop 103, $Mb(s)$ represents a closed loop transmission function of the post-stage phase-locked loop 104, and $\pi t$ represents a total damping factor and $\omega nt$ represents a total natural angular frequency from the data signal input to the clock signal output, respectively.

$$Jtra_t(s) = Jtra_t(j\omega) = |M_a(s)| \cdot |M_b(s)| / \{|M_a(0)| \cdot |M_b(0)|\} \qquad (9)$$

$$\omega_{ct} = 2\pi f_{ct} = 2\zeta_t \omega_{nt} \qquad (10)$$

The jitter transfer characteristic of the phase-locked loop has, in general, a primary frequency cutoff characteristic. Therefore, this can be approximated by the following equations (11), (12) and (13), where $\omega ca$ represents a cutoff angular frequency, $\zeta a$ represents a damping factor, and $\omega na$ represents a natural angular frequency of the pre-stage phase-locked loop 103 respectively, and $\omega cb$ represents a cutoff angular frequency, $\zeta b$ represents a damping factor, and $\omega nb$ represents a natural angular frequency of the post-stage phase-locked loop 104 respectively.

$$1/\omega_{ct}^2 = 1/\omega_{ca}^2 + 1/\omega_{cb}^2 \qquad (11)$$

$$\omega_{ca} = 2\pi f_{ca} = 2\zeta_a \omega_{na} \qquad (12)$$

$$\omega_{cb} = 2\pi f_{cb} = 2\zeta_b \omega_{nb} \qquad (13)$$

To simplify the explanation, it is assumed that the cutoff angular frequency $\omega ca$ of the pre-stage phase-locked loop 103 and the cutoff angular frequency $\omega cb$ of the post-stage phase-locked loop 104 are equal. Then, the following equation (14) is established based on the equation (11).

$$\omega_{cf}=\omega_{ca}/\sqrt{2} \quad (14)$$

It is known from the equation (14) that, in the data clock regenerating apparatus 100 according to the first embodiment, when the cutoff angular frequencies of the pre-stage phase-locked loop 103 and the post-stage phase-locked loop 104 are expanded respectively to $\sqrt{2}$ times the cutoff angular frequency of the phase-locked loop 603 in the conventional example shown in FIG. 6, the total cutoff angular frequency remains unchanged from that of the phase-locked loop 603 in the conventional example.

Figure 2A:
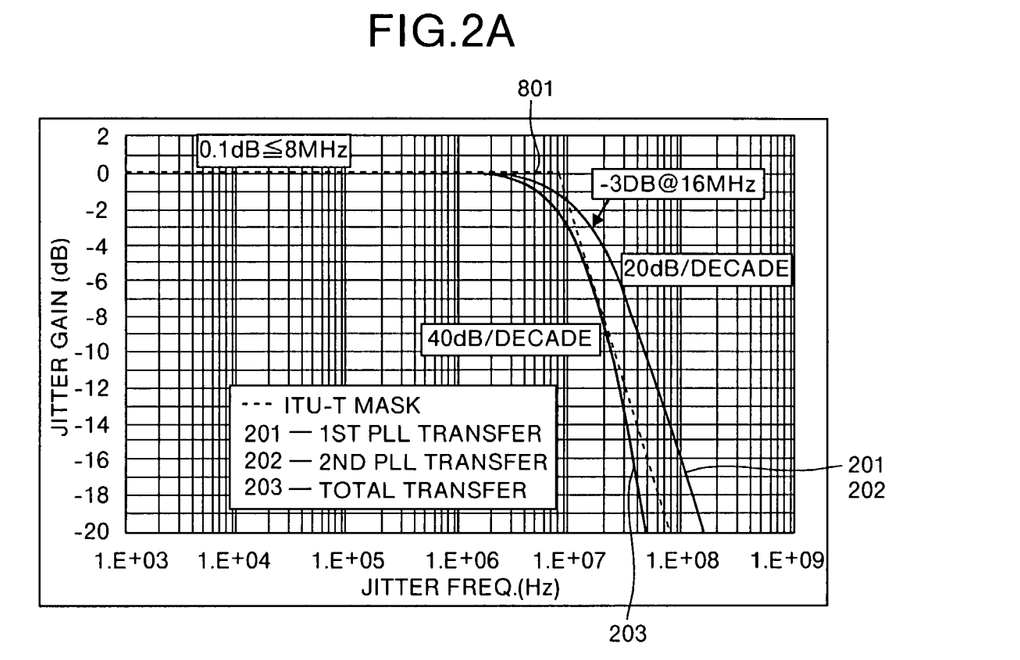
FIG. 2A shows a jitter transfer characteristic and FIG. 2B shows a jitter tolerance characteristic.
Figure 2B:
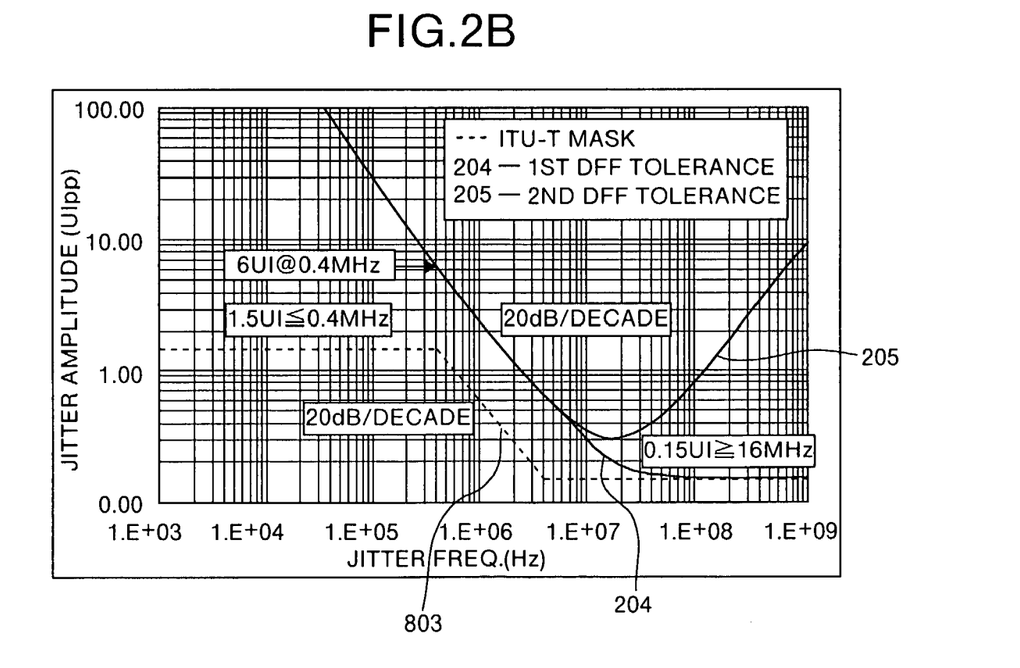

FIG. 2A and FIG. 2B are diagrams that compare the characteristics shown in the ITU-T standard with the characteristics of the data clock regenerating apparatus 100 that have been obtained by setting parameters to satisfy these characteristics. FIG. 2A shows the jitter transfer characteristic, with the jitter frequency (unit Hz) shown in the horizontal axis, and the jitter gain (unit dB) shown in the vertical axis. FIG. 2B shows the jitter tolerance characteristic, with the jitter frequency (Hz) shown in the horizontal axis, and the jitter amplitude (unit UIpp) that shows jitter tolerance shown in the vertical axis. According to the logarithmic scale of the horizontal axis, "1.E+07" shows $1 \times 10^7$ Hz=10 MHz, for example. The characteristics 801 and 803 of the ITU-T standard are shown in FIG. 8.

FIG. 2A shows one example of the jitter transfer characteristic of the data clock regenerating apparatus 100 according to the first embodiment obtained from the equation (9). In FIG. 2A, 1st PLL Transfer 201 shows the jitter transfer characteristic of the pre-stage phase-locked loop 103. 2nd PLL Transfer 202 shows the jitter transfer characteristic of the post-stage phase-locked loop 104. Total Transfer 203 shows a total jitter transfer characteristic. As the jitter transfer characteristic of the pre-stage phase-locked loop 103 and the jitter transfer characteristic of the post-stage phase-locked loop 104 are the same, the 1st PLL Transfer 201 and the 2nd PLL Transfer 202 are shown as the same superimposed line. However, to simplify the explanation, in the present calculation, parameters are set such that the total jitter transfer characteristic 203 becomes a maximum cutoff frequency that coincides with the ITU-T mask.

The jitter transfer standard mask 801 of the ITU-T defines an inclination of 20 dB/decade in the high-frequency area that exceeds the upper limit value 8 MHz, considering the primary frequency cutoff characteristic. In the first embodiment, the phase-locked loops are connected in a file at two stages. Therefore, the 1st PLL Transfer 201 and the 2nd PLL Transfer 202 show characteristics of limiting the jitter transmission band with the inclination of 20 dB/decade substantially in a similar manner, in the high-frequency area that exceeds the upper limit value 8 MHz of the jitter transfer standard mask 801 of the ITU-T. However, as the Total Transfer 203 sharply limits the jitter transmission band with the inclination of 40 dB/decade in the high-frequency area, this has a characteristic that is accommodated within the range of the jitter transfer standard mask 801 of the ITU-T. Consequently, when the cutoff frequencies of the phase-locked loops 103 and 104 according to the structure of the first embodiment are expanded to two times (fca=fcb=16 MHz) of the cutoff frequency of the conventional phase-locked loop 603, it is possible to satisfy the standard of the ITU-T.

The jitter tolerance characteristic $Jtol_a(s)$ and the corner angular frequency $\omega ca$ of the output of the pre-stage discriminator 106 are obtained from the following equations (15) and (16), where Ma(s) represents a closed loop transmission function, $\zeta a$ represents a damping factor, and $\omega na$ represents a natural angular frequency of the pre-stage phase-locked loop 103 respectively, and $\Phi a$ represents a discrimination phase margin of the discriminator 106.

$$Jtol_a(s)=Jtol_a(j\omega)=\Phi_a/|1-M_a(s)| \quad (15)$$

$$\omega_{ca}=2\pi f_{ca}=2\zeta_a\omega_{na} \quad (16)$$

Further, the jitter tolerance characteristic $Jtol_b(s)$ and the corner angular frequency $\omega cb$ of the output of the post-stage discriminator 107 are obtained from the following equations (17) and (18), where Mb(s) represents a closed loop transmission function, $\zeta b$ represents a damping factor, and $\omega nb$ represents a natural angular frequency of the post-stage phase-locked loop 104 respectively, and $\Phi b$ represents a discrimination phase margin of the discriminator 107.

$$Jtol_b(s)=Jtol_b(j\omega)=\Phi_b/\{|M_a(s)|\cdot|1-M_b(s)|\} \quad (17)$$

$$\omega_{cb}=2\pi f_{cb}=2\zeta_b\omega_{nb} \quad (18)$$

It can be known from the equation (12) and the equation (16) that the cutoff frequency of the jitter transfer characteristic of the output of the pre-stage phase-locked loop 103 and the corner frequency of the jitter tolerance characteristic of the output of the pre-stage discriminator 106 are equal 16 MHz. Further, it is known from the equation (13) and the equation (18) that the cutoff frequency of the jitter transfer characteristic of the output of the post-stage phase-locked loop 104 and the corner frequency of the jitter tolerance characteristic of the output of the post-stage discriminator 107 are equal 16 MHz.

FIG. 2B shows one example of the jitter tolerance characteristics of the discriminators 106 and 107 in the data clock regenerating apparatus 100 that has the cutoff frequency of the total jitter transfer characteristic which satisfies the ITU-T standard shown in FIG. 2A. In FIG. 2B, 1st DFF Tolerance 204 shows one example of the jitter tolerance characteristic of the pre-stage discriminator 106 obtained from the equation (15). 2nd DFF Tolerance 205 shows one example of the jitter tolerance characteristic of the post-stage discriminator 107 obtained from the equation (17) To clarify the point at issue, discrimination phase margins of the discriminators 106 and 107 are the worst condition $\Phi a=\Phi b=0.15$ UI which satisfies the ITU-T standard.

As shown in FIG. 2B, the jitter tolerance characteristic (the 1st DFF Tolerance 204) of the output of the pre-stage discriminator 106 obtained from the equation (15) is such that the jitter tolerance in the low-level corner frequency 400 KHz is 6.0 UI (6 UI@0.4 MHz) that is two times the jitter tolerance 3.0 UI of the conventional example shown in FIG. 6. For a jitter having a frequency from this to a frequency of the corner frequency fca=16 MHz, jitter tolerance approximately increases with an inclination of 20 dB/decade toward the low-level corner frequency 400 KHz. For a jitter having a frequency not less than the corner frequency fca=16 MHz, jitter tolerance equal to the discrimination phase margin (0.15 UI) of the discriminator 106 is held (0.15 UI$\geq$6 MHz).

Further, from the equation (16), when the discrimination phase margin of the discriminator 106 is the worst 0.15 UI, a condition for the corner frequency to satisfy the jitter tolerance standard of the ITU-T is given by the following equation (19).

$$\omega_{ca}=2\pi f_{ca}\geq 2\pi\cdot 4 \; MHz \quad (19)$$

Further, as shown in FIG. 2B, the jitter tolerance characteristic (the 2nd DFF Tolerance 205) of the output of the post-stage discriminator 107 obtained from the equation (17)

is such that the jitter tolerance in the low-level corner frequency 400 KHz is 6.0 UI (6 UI@0.4 MHz) that is two times the jitter tolerance 3.0 UI of the conventional example shown in FIG. 6. For a jitter having a frequency from this to a frequency of the corner frequency fcb=16 MHz, jitter tolerance increases with an inclination of 20 dB/decade from the discrimination phase margin (0.15 UI) of the discriminator 107 toward the low-level corner frequency 400 KHz. In other words, for the jitter having the frequency not higher than the corner frequency fcb=16 MHz, the jitter tolerance characteristic has a characteristic that it is approximately superimposed with the 1st DFF Tolerance 204.

$|Ma(s)|$ is multiplied to the denominator in the equation (17). Therefore, for the jitter having the frequency not lower than the corner frequency, jitter tolerance approximately increases with an inclination of 20 dB/decade from the discrimination phase margin (0.15 UI) of the discriminator 106. Jitter tolerance increases for the jitter having a frequency not lower than the corner frequency fcb=16 MHz. This is because, qualitatively, the jitter superimposed on the data signal input is discriminated with the clock signal that has been jitter-suppressed in the pre-stage phase-locked loop 103, and this is input to the post-stage discriminator 107.

From the equation (18), a condition for the corner frequency fcb to satisfy the jitter tolerance standard of the ITU-T when the discrimination phase margin of the discriminator 107 is the worst 0.15 UI is given by the following equation (20).

$$\omega_{cb} = 2\pi f_{cb} \geq 2\pi \cdot 4 \text{ MHz} \quad (20)$$

As explained above, according to the data clock regenerating apparatus 100 of the first embodiment, an upper limit value of a jitter transmission frequency in the pre-stage phase-locked loop 103 in which a jitter signal superimposed on the data signal input from the data input signal terminal 101 is transmitted to a regenerated clock signal of this phase-locked loop 103 without being suppressed, can be set to not lower than an upper limit value of a jitter transmission frequency that is required in the ITU-T. Further, an upper limit value of a total jitter transmission frequency from the phase-locked loop 103 to the phase-locked loop 104 in which a jitter signal superimposed on the data signal input from the data signal input terminal 101 is transmitted to the regenerated clock signal of the post-stage phase-locked loop 104 without being suppressed, can be set to not higher than the upper limit value of the jitter transmission frequency that is required in the ITU-T.

In other words, in order to satisfy both the jitter transfer standard and the jitter tolerance standard prescribed by the ITU-T at the same time, the cutoff frequency of the jitter tolerance characteristics (=the corner frequency of the jitter tolerance characteristic's) of the phase-locked loops 103 and 104 that are connected in a file may be in the frequency range of 4 MHz to 16 MHz, when the discrimination phase margin of the discriminators 106 and 107 is the worst 0.15 UI. Therefore, it is possible to expand the frequency range as compared with the cutoff frequency range of 4 MHz to 8 MHz in the conventional example. Consequently, it becomes possible to enlarge the level of design freedom including a temperature of an open loop gain, a power source voltage variation, and a variation in the characteristics of a manufacturing process. As a result, it is possible to easily design the data clock regenerating apparatus that satisfies the ITU-T standard.

In the first embodiment, the discrimination phase margins of the discriminators 106 and 107 are explained as the worst condition $\Phi a = \Phi b = 0.15$ UI which satisfies the ITU-T standard. However, usually, the discriminators have much larger discrimination phase margins. According to the conventional example, the lower limit of the cutoff frequency is lowered to 4 MHz or below corresponding to the increase in the discrimination phase margin. According to the structure of this embodiment, the lower limit of the cutoff frequency becomes much lower. Therefore, it is also possible to enlarge the cutoff frequency range which satisfies the jitter transfer standard and the jitter tolerance standard at the same time.

Figure 3:
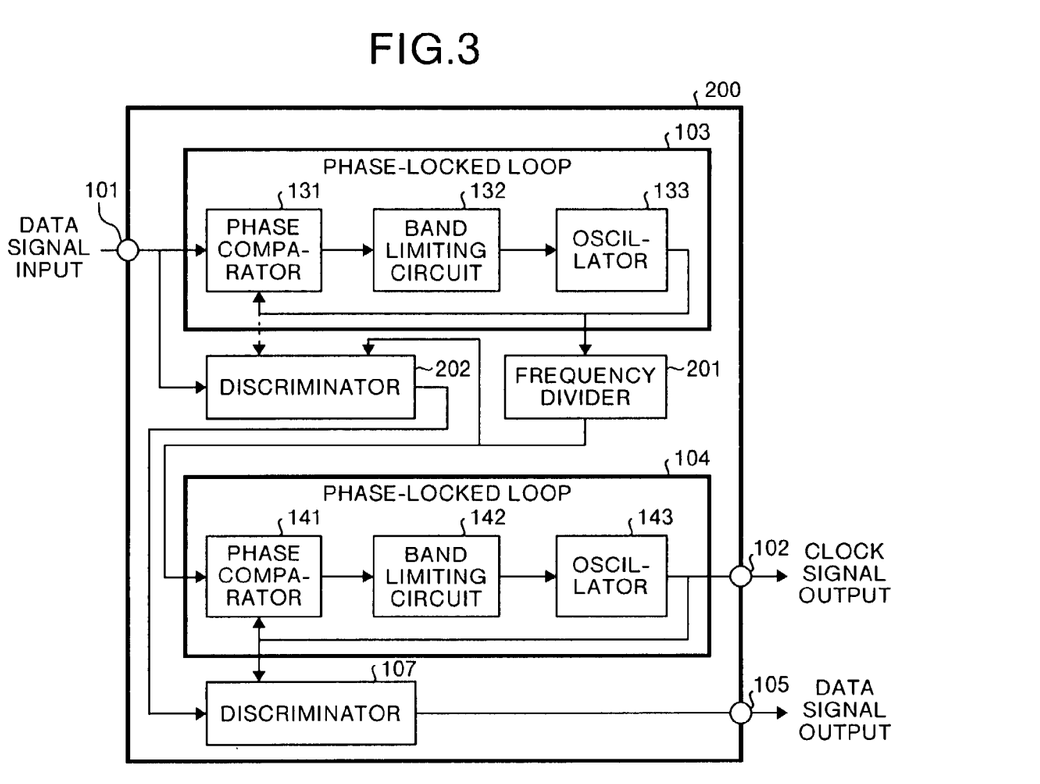
FIG. 3 is a block diagram showing a structure of a data clock regenerating apparatus according to a second embodiment of this invention.

A second embodiment of this invention will be explained below. FIG. 3 is a block diagram showing a structure of a data clock regenerating apparatus according to a second embodiment of this invention. As shown in FIG. 3, according to a data clock regenerating apparatus 200 of the second embodiment, a frequency divider 201 is provided between the pre-stage phase-locked loop 103 and the post-stage phase-locked loop 104 in the structure shown in FIG. 1. Following this, a discriminator 202 is provided in place of the discriminator 106. The rest of the structure is similar to that shown in FIG. 1. Portions according to the second embodiment will be mainly explained.

In FIG. 3, the frequency divider 201 divides an output clock signal of the oscillator 133 in the pre-stage phase-locked loop 103, and generates a plurality of parallel low-speed clock signals that have mutually different phases. The generated plurality of parallel low-speed clock signals are input to the phase comparator 141 in the post-stage phase-locked loop 104 and the discriminator 202. Therefore, the post-stage phase-locked loop 104 generates low-speed clock signals of which frequency and phase are synchronous with those of a plurality of parallel low-speed clock signals, and outputs the low-speed clock signals to the clock signal output terminal 102 and the discriminator 107.

The discriminator 202 discriminates an input data signal with a plurality of parallel low-speed clock signals that are input from the frequency divider 201, expands the data signal into parallel low-speed data, and outputs the data to the discriminator 107. In other words, the discriminator 202 functions as a data separator that expands a high-speed data signal that has been input to the data signal input terminal 101 into a plurality of parallel low-speed data signals. A change-point phase of the parallel low-speed data becomes a phase of a low-speed clock signal that discriminates each data. Therefore, the discriminator 107 finally discriminates again the parallel low-speed data with one low-speed clock, and therefore, the change-point phases of all the parallel low-speed data become the same.

A jitter characteristic of the data clock regenerating apparatus 200 having the above structure will be explained. First, a jitter transfer characteristic becomes as follows. As the frequency divider 201 only frequency-divides an input clock signal into a low-speed clock signal, an absolute value (in the unit of second) of jitter superimposed on the low-speed clock signal is equal to an absolute value of jitter superimposed on an output clock signal of the oscillator 133. Therefore, the jitter transfer characteristic of the output of the frequency divider 201 is similar to that of the first embodiment, and this is expressed by the equation (1) to the equation (8). A total jitter transfer characteristic from the data signal input terminal 101 to the clock signal output terminal 102 is also similar to that of the first embodiment, and this is expressed by the equation (9) to the equation (14).

A jitter tolerance characteristic will be explained next. As the absolute value (in the unit of second) of jitter superimposed on the low-speed clock signal is equal to the absolute value of jitter superimposed on the output clock signal of the oscillator 133, a jitter tolerance characteristic of the discriminator 202 is similar to that of the first embodiment, and this is expressed by the equation (15) and the equation (16).

When the number of data separated by the discriminator 202 or the frequency-dividing ratio of the frequency divider 201 is expressed as N, the bit rate of the parallel data signal input to the discriminator 107 becomes 1/N of that of the input data signal. Therefore, the phase margin of the discriminator 107 increases to N times that of the first embodiment, and the jitter tolerance characteristic shown in the following equation (21) is obtained. It can be known from the equation (21) that the jitter tolerance characteristic is improved from that of the first embodiment.

$$Jtol_b(s) = Jtol_b(j\omega) = N\Phi_b / \{|M_a(s)| \cdot |1 - M_b(s)|\} \quad (21)$$

In the second embodiment, the jitter tolerance of the post-stage discriminator 107 increases as compared with the jitter tolerance in the first embodiment. Therefore, even when the cutoff frequency of the jitter transfer characteristic in the post-stage phase-locked loop 104 is set to a lower frequency side of 1/N as compared with the cutoff frequency of the first embodiment, it is possible to satisfy both the jitter transfer standard and the jitter tolerance standard prescribed by the ITU-T. This also means that in the second embodiment, it is possible to set the cutoff frequency of the jitter transfer characteristic in the pre-stage phase-locked loop 103 to a higher frequency side than that of the first embodiment.

As explained above, according to the data clock regenerating apparatus 200 of the second embodiment, the set range of the cutoff frequency of the jitter transfer characteristic (=the corner frequency of the jitter tolerance characteristics) which satisfies both the jitter transfer standard and the jitter tolerance standard prescribed by the ITU-T becomes wider than that of the first embodiment. Consequently, it becomes possible to enlarge the level of design freedom including a temperature of an open loop gain, a power source voltage variation, and a variation in the characteristics of a manufacturing process. As a result, it is possible to design the data clock regenerating apparatus that satisfies the ITU-T standard more easily than it is in the first embodiment.

In the second embodiment, it has been explained that the output of the frequency divider 201 is input to the discriminator 202. It is also possible to arrange such that the output clock of the oscillator 133 is input to the discriminator 202 as a differential signal consisting of a positive phase and a negative phase, in place of the output of the frequency divider 201, as shown by a broken line in FIG. 3. Further, the discriminator 202 may output two series of parallel low-speed data signals. With this arrangement, it is also possible to obtain effects similar to the above.

Figure 4:
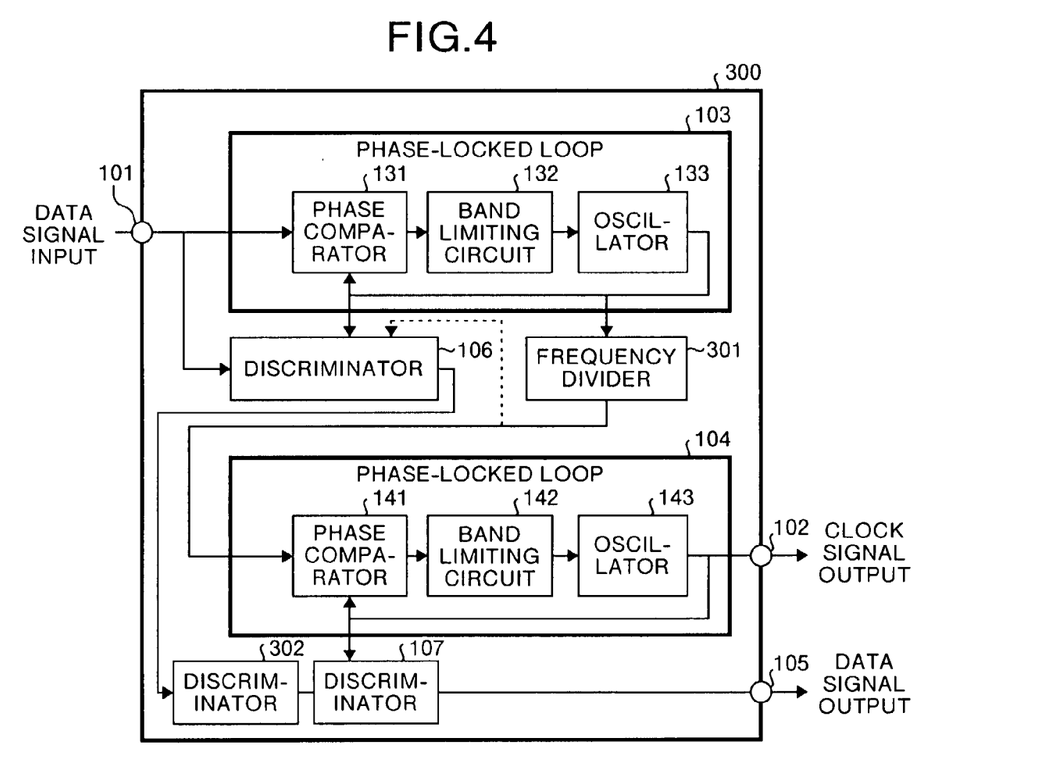
FIG. 4 is a block diagram showing a structure of a data clock regenerating apparatus according to a third embodiment of this invention.

A third embodiment of this invention will be explained below. FIG. 4 is a block diagram showing a structure of a data clock regenerating apparatus according to a third embodiment of the present invention. As shown in FIG. 4, according to a data clock regenerating apparatus 300 of the third embodiment, a frequency divider 301 is provided between the pre-stage phase-locked loop 103 and the post-stage phase-locked loop 104 in the structure shown in FIG. 1. Following this, a third discriminator 302 is provided between the pre-stage discriminator 106 and the post-stage discriminator 107. The rest of the structure is similar to that shown in FIG. 1. Portions according to the third embodiment will be mainly explained.

In FIG. 4, the frequency divider 301 divides an output clock signal of the oscillator 133 in the pre-stage phase-locked loop 103, and generates a plurality of parallel low-speed clock signals that have mutually different phases, in a similar manner to that of the frequency divider 201 in the second embodiment. The generated plurality of parallel low-speed clock signals are input to the phase comparator 141 in the post-stage phase-locked loop 104 and the third discriminator 302. Therefore, the post-stage phase-locked loop 104 generates low-speed clock signals of which frequency and phase are synchronous with those of a plurality of parallel low-speed clock signals, and outputs the low-speed clock signals to the clock signal output terminal 102 and the discriminator 107, in a similar manner to that of the second embodiment.

The discriminator 302 discriminates a data signal input from the pre-stage discriminator 106 with a plurality of parallel low-speed clock signals that are input from the frequency divider 301, expands the data signal into parallel low-speed data, and outputs the data to the discriminator 107. In other words, the discriminator 302 functions as a data separator that expands a high-speed data signal that has been input from the pre-stage discriminator 106 into a plurality of parallel low-speed data signals. A change-point phase of the parallel low-speed data becomes a phase of a low-speed clock signal that discriminates each data. Therefore, the discriminator 107 finally discriminates again the parallel low-speed data with one low-speed clock, and therefore, the change-point phases of all the parallel low-speed data become the same.

A jitter characteristic of the data clock regenerating apparatus 300 having the above structure will be explained. First, a jitter transfer characteristic becomes as follows. The jitter transfer characteristic of the output of the frequency divider 301 is similar to that of the first embodiment, and this is expressed by the equation (1) to the equation (8), as explained in the second embodiment. A total jitter transfer characteristic from the data signal input terminal 101 to the clock signal output terminal 102 is also similar to that of the first embodiment, and this is expressed by the equation (9) to the equation (14).

A jitter tolerance characteristic will be explained next. A jitter tolerance characteristic of the pre-stage discriminator 106 is similar to that of the first embodiment, and this is expressed by the equation (15) and the equation (16), as explained in the second embodiment. An absolute value (in the unit of second) of jitter superimposed on a low-speed clock signal output from the frequency divider 301 and on an output data signal of the pre-stage discriminator 106 is equal to an absolute value of jitter superimposed on an output clock signal of the oscillator 133. Further, an absolute value of jitter on the input data signal of the third discriminator 302 is equal to an absolute value of jitter on the clock signal input from the frequency divider 301, and the jitter tolerance characteristic becomes infinite.

When the frequency-dividing ratio of the frequency divider 301 is expressed as N, the bit rate of the parallel data signal input to the post-stage discriminator 107 becomes 1/N of that of the input data signal. Therefore, the phase margin of the third discriminator 302 increases to N times, in a similar manner to that of the discriminator 202 in the second embodiment, and the jitter tolerance characteristic shown in the above equation (21) is obtained. Consequently, the jitter tolerance characteristic is improved from that of the first embodiment, like that in the second embodiment.

In the third embodiment, the jitter tolerance of the post-stage discriminator 107 increases as compared with the jitter tolerance in the first embodiment. Therefore, even when the cutoff frequency of the jitter transfer characteristic in the post-stage phase-locked loop 104 is set to a lower frequency side of 1/N as compared with the cutoff frequency of the first embodiment, it is possible to satisfy both the jitter transfer standard and the jitter tolerance standard prescribed by the ITU-T. This also means that in the third embodiment, it is possible to set the cutoff frequency of the jitter transfer characteristic in the pre-stage phase-locked loop 103 to a higher frequency side than that of the first embodiment.

As explained above, according to the data clock regenerating apparatus 300 of the third embodiment, the set range of the cutoff frequency of the jitter transfer characteristic (=the corner frequency of the jitter tolerance characteristics) which satisfies both the jitter transfer standard and the jitter tolerance standard prescribed by the ITU-T becomes wider than that of the first embodiment. Consequently, it becomes possible to enlarge the level of design freedom including a temperature of an open loop gain, a power source voltage variation, and a variation in the characteristics of a manufacturing process. As a result, it is possible to design the data clock regenerating apparatus that satisfies the ITU-T standard more easily than it is in the first embodiment, like in the second embodiment.

In the third embodiment, it has been explained that the output clock signal of the oscillator 133 is input to the pre-stage discriminator 106. It is also possible to arrange such that the output clock signal of the frequency divider 301 is input to the pre-stage discriminator 106, in place of the output clock signal of the oscillator 133, as shown by a broken line in FIG. 4. The pre-stage discriminator 106 may operate as a data separator like the discriminator 202 in the second embodiment. With this arrangement, it is also possible to obtain effects similar to the above.

Figure 5:
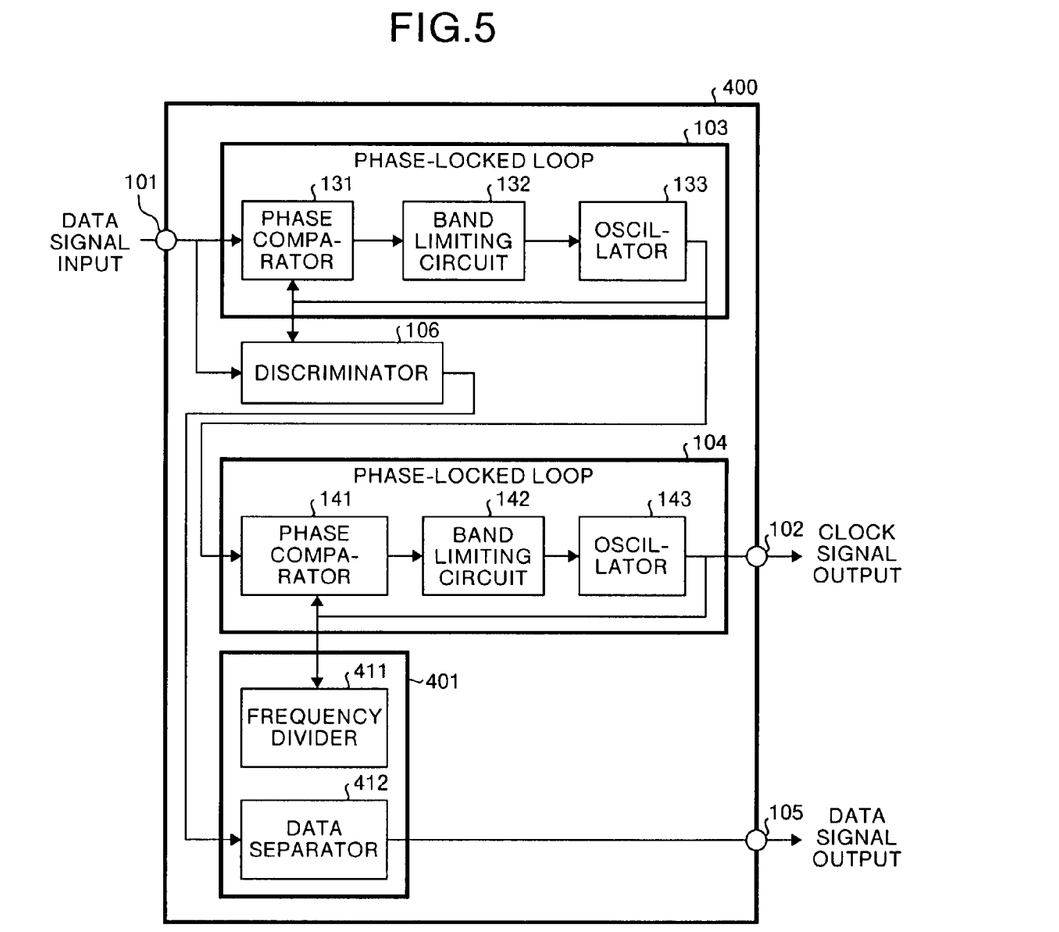
FIG. 5 is a block diagram showing a structure of a data clock regenerating apparatus according to a fourth embodiment of this invention.

A fourth embodiment of this invention will be explained below. FIG. 5 is a block diagram showing a structure of a data clock regenerating apparatus according to a fourth embodiment of this invention. As shown in FIG. 5, according to a data clock regenerating apparatus 400 of the fourth embodiment, a discriminator 401 is provided in place of the post-stage discriminator 107 in the structure shown in FIG. 1. The rest of the structure is similar to that shown in FIG. 1. Portions according to the third embodiment will be mainly explained.

In FIG. 5, the discriminator 401 consists of a frequency divider 411 and a data separator 412. The frequency divider 411 frequency-divides a clock signal generated in the post-stage phase-locked loop 104 to generate a plurality of parallel low-speed clock signals having mutually different phases, and supplies these signals to the data separator 412. The data separator 412 discriminates a data signal output from the pre-stage discriminator 106 with a plurality of parallel low-speed clock signals, and expands the data signal into parallel low-speed data. Parallel low-speed data signals are output to the data signal output terminal 105. In other words, the data clock regenerating apparatus 400 functions as a data separating apparatus that separates a high-speed data signal input from the data signal input terminal 101 into a plurality of parallel low-speed data signals.

Jitter characteristics of the data clock regenerating apparatus 400 having the above structure will be explained. In the fourth embodiment, an output clock signal of the oscillator 143 in the post-stage phase-locked loop 104 is frequency-divided to provide a discrimination clock signal. Therefore, a jitter transfer characteristic and a jitter tolerance characteristic are similar to those of the first embodiment, they are expressed by the equation (9) to the equation (20). As a result, in the fourth embodiment, it is also possible to obtain the effect of enlarging a cutoff frequency range which satisfies both the jitter transfer standard and the jitter tolerance standard at the same time, in a similar manner to that explained in the first embodiment.

In the structure shown in FIG. 5, it is also possible to achieve the function of the data separator in a similar manner, when the post-stage phase-locked loop 104 is deleted and the output clock signal of the oscillator 133 is input to the frequency divider 411. A jitter transfer characteristic in the above case and a jitter tolerance characteristic of the discriminator 106 are similar to those of the conventional example, and they can be expressed by the equation (1) to the equation (8). As the frequency divider 411 frequency-divides the output clock signal of the oscillator 133, an absolute value (in the unit of second) of jitter of the frequency-divided clock signal is equal to an absolute value of jitter of the oscillator 133. Therefore, as the clock signal obtained by frequency-dividing the output clock signal of the oscillator 133 becomes the discrimination clock signal, the jitter tolerance characteristic of the data separator 412 is also similar to that of the conventional example, and this can be expressed by the equation (6) to the equation (8). In other words, it can be known that when the phase-locked loop has a one-stage structure like in the conventional example, it is not possible to enlarge the level of design freedom including a temperature of an open loop gain K, a power source voltage variation, and a variation in the characteristics of a manufacturing process.

In the fourth embodiment, an example of application to the first embodiment has been explained. It is also possible to obtain similar effects when a discriminator having a frequency divider and a data separator is provided in place of the discriminator 107 in the second embodiment and the third embodiment respectively.

According to this invention, the first phase-locked loop which generates a first clock signal that is synchronous with a frequency of an input data signal and that is also in phase synchronism with a change point of the data signal, and the second phase-locked loop which generates a second clock signal of which frequency and phase are synchronous with the first clock signal generated by the first phase-locked loop, are connected in a file. As a result, an upper limit value of a jitter transmission frequency in the first phase-locked loop in which a jitter signal superimposed on the input data signal is transmitted to the first clock signal without being suppressed, is set equal to or above an upper limit value of a jitter transmission frequency that is required in the apparatus. Further, an upper limit value of a jitter transmission frequency from the first phase-locked loop to the second phase-locked loop in which a jitter signal superimposed on the input data signal is transmitted to the second clock signal without being suppressed, is set equal to or less than an upper limit value of a jitter transmission frequency that is required in the apparatus. Therefore, it is possible to set a wider frequency range which satisfies the jitter characteristics required in the apparatus than a frequency range when the one-stage phase-locked loop is employed. Thus, it becomes possible to enlarge the level of design freedom, and it becomes easy to design the data clock regenerating apparatus that satisfies the required jitter characteristics.

Moreover, the frequency-dividing unit divides the first clock signal generated by the first phase-locked loop, thereby to generate a plurality of parallel low-speed clock signals, outputs the generated parallel low-speed clock signals to the second phase-locked loop as a reference clock, and also outputs the generated parallel low-speed clock signals to the first discriminating unit as a discrimination clock. The first discriminating unit discriminates the input data signal according to the low-speed clock signal that is output from the frequency-dividing unit, and expands the signal. Further, as the second phase-locked loop generates a clock signal that is synchronous with the low-speed clock signal generated by the frequency-dividing unit, the second discriminating unit that uses this low-speed clock signal as the discrimination clock signal discriminates the low-speed data signal from the first discriminating unit with one low-speed clock, and outputs this signal. Therefore, it is possible to obtain the data separating apparatus capable of further enlarging the level of design freedom and separating a high-speed data signal into low-speed parallel data signals.

Furthermore, the frequency-dividing unit divides the first clock signal generated by the first phase-locked loop, thereby to generate a plurality of parallel low-speed clock signals, and outputs the generated parallel low-speed clock signals to the second phase-locked loop as a reference clock. Further, the first discriminating unit discriminates the input high-speed data signal according to the input first clock signal as a differential signal, that is generated in the first phase-locked loop, and outputs two series of parallel low-speed data signals. Further, as the second phase-locked loop generates a clock signal that is synchronous with the low-speed clock signal generated by the frequency-dividing unit, the second discriminating unit that uses this low-speed clock signal as the discrimination clock signal discriminates the two series of parallel low-speed data signals output from the first discriminating unit respectively, and outputs these signals. Therefore, it is possible to obtain the data separating apparatus capable of further enlarging the level of design freedom and separating a high-speed data signal into low-speed parallel data signals.

Moreover, the frequency-dividing unit divides the first clock signal generated by the first phase-locked loop, thereby to generate a plurality of parallel low-speed clock signals, outputs the generated parallel low-speed clock signals to the second phase-locked loop as a reference clock, and also outputs the generated parallel low-speed clock signals to the third discriminating unit as a discrimination clock. The third discriminating unit discriminates a data signal output from the first discriminating unit according to the low-speed clock signal that is output from the frequency-dividing unit, expands the signal into a low-speed data signal, and outputs this data signal to the second discriminating unit. The second discriminating unit that uses the low-speed clock generated in the second phase-locked loop as a discrimination clock signal discriminates the low-speed data output from the third discriminating unit with one low-speed clock, and outputs this signal. Therefore, it is possible to obtain the data separating apparatus capable of further enlarging the level of design freedom and separating a high-speed data signal into low-speed parallel data signals.

Furthermore, the first discriminating unit discriminates the input data signal according to the low-speed clock signal that is output from the frequency-dividing unit. The third discriminating unit discriminates the low-speed data signal that has been discriminated and expanded by the first discriminating unit, with the low-speed clock signal, and expands this signal into a low-speed data signal. The second discriminating unit that uses the low-speed clock generated in the second phase-locked loop as a discrimination clock signal discriminates the low-speed data output from the third discriminating unit, and outputs this signal. Therefore, in order to separate a high-speed data signal into low-speed parallel data signals, the first discriminating unit and the third discriminating unit can share the role of expanding the data into the low-speed data.

Moreover, in the second discriminating unit, the frequency-dividing unit divides the second clock signal generated by the second phase-locked loop, thereby to generate a plurality of parallel low-speed clock signals, and the data-dividing unit discriminates the data signal output from the first discriminating unit according to the plurality of parallel low-speed clock signals, and expands this data signal into a parallel low-speed data. Therefore, it is possible to obtain the data separating apparatus capable of further enlarging the level of design freedom and separating a high-speed data signal into low-speed parallel data signals.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A data clock regenerating apparatus comprising:
a first phase-locked loop which generates a first clock signal that is synchronous with a frequency of an input data signal and that is also in phase synchronism with a change point of the data signal;
a first discriminating unit which regenerates the input data signal by discriminating this input data signal with the first clock signal;
a second phase-locked loop which generates a second clock signal of which frequency and phase are synchronous with the first clock signal; and
a second discriminating unit that regenerates an output data signal of the first discriminating unit by discriminating this output data signal with the second clock signal, wherein
an upper limit value of a jitter transmission frequency in the first phase-locked loop in which a jitter signal superimposed on the input data signal is transmitted to the first clock signal without being suppressed, is not less than an upper limit value of a jitter transmission frequency that is required in the apparatus, and
an upper limit value of a jitter transmission frequency from the first phase-locked loop to the second phase-locked loop in which a jitter signal superimposed on the input data signal is transmitted to the second clock signal without being suppressed, is not more than an upper limit value of a jitter transmission frequency that is required in the apparatus.

2. The data clock regenerating apparatus according to claim 1, further comprising a frequency-dividing unit which divides the first clock signal generated by the first phase-locked loop, thereby to generate a plurality of parallel low-speed clock signals, and outputs the generated parallel low-speed clock signals to the second phase-locked loop as a reference clock, wherein
the first discriminating unit discriminates the input data signal according to the low-speed clock signals that are output from the frequency-dividing unit.

3. The data clock regenerating apparatus according to claim 1, further comprising a frequency-dividing unit which divides the first clock signal generated by the first phase-locked loop, thereby to generate a plurality of parallel low-speed clock signals, and outputs the generated parallel low-speed clock signals to the second phase-locked loop as a reference clock, wherein the first discriminating unit discriminates the input data signal according to the first clock signal generated by the first phase-locked loop input as a differential signal, and outputs two series of parallel low-speed data signals.

4. The data clock regenerating apparatus according to claim 1, further comprising:
   a frequency-dividing unit which divides the first clock signal generated by the first phase-locked loop, thereby to generate a plurality of parallel low-speed clock signals, and outputs the generated parallel low-speed clock signals to the second phase-locked loop as a reference clock; and
   a third discriminating unit which discriminates a data signal output from the first discriminating unit according to the low-speed clock signals that are output from the frequency-dividing unit, and outputs this data signal to the second discriminating unit.

5. The data clock regenerating apparatus according to claim 4, wherein
   the first discriminating unit discriminates the input data signal according to the low-speed clock signals that are output from the frequency-dividing unit.

6. The data clock regenerating apparatus according to claim 1, wherein the second discriminating unit comprises:
   a frequency-dividing unit which divides the second clock signal generated by the second phase-locked loop, thereby to generate a plurality of parallel low-speed clock signals; and
   a data-dividing unit which discriminates a data signal output from the first discriminating unit according to the plurality of parallel low-speed clock signals, and expands this data signal into a parallel low-speed data.

* * * * *